United States Patent [19]
Polischuk et al.

[11] Patent Number: 5,880,472
[45] Date of Patent: Mar. 9, 1999

[54] MULTILAYER PLATE FOR X-RAY IMAGING AND METHOD OF PRODUCING SAME

[75] Inventors: Bradley Trent Polischuk, Pierrefonds; Alain Jean, Montreal, both of Canada

[73] Assignee: FTNI Inc., Montreal, Canada

[21] Appl. No.: 827,512

[22] Filed: Mar. 28, 1997

[30] Foreign Application Priority Data

Sep. 3, 1996 [CA] Canada .................................. 2184667

[51] Int. Cl.⁶ ..................... H01L 31/0272; H01L 31/115; H01L 27/146
[52] U.S. Cl. ................. 250/370.09; 250/370.11; 250/370.12; 257/42; 257/53; 257/429; 257/428; 257/444
[58] Field of Search ........................ 250/370.11, 370.09, 250/370.12; 257/42, 428, 429, 443, 444, 53

[56] References Cited

U.S. PATENT DOCUMENTS

| | | |
|---|---|---|
| 3,041,166 | 6/1962 | Bardeen . |
| 3,975,635 | 8/1976 | Lennon . |
| 4,286,033 | 8/1981 | Neyhart et al. . |
| 4,338,387 | 7/1982 | Hewitt . |
| 4,463,279 | 7/1984 | Shidara et al. ............................. 257/42 |
| 4,554,453 | 11/1985 | Feight et al. ....................... 250/370.12 |
| 4,770,965 | 9/1988 | Fender et al. . |
| 4,891,290 | 1/1990 | Narita . |
| 4,990,419 | 2/1991 | Kitagawa . |
| 5,021,310 | 6/1991 | Kitagawa . |
| 5,023,661 | 6/1991 | Fender et al. . |
| 5,198,673 | 3/1993 | Rougeot et al. .................. 250/370.11 |
| 5,235,195 | 8/1993 | Tran et al. .............................. 257/444 |
| 5,320,927 | 6/1994 | Fender et al. . |
| 5,330,863 | 7/1994 | Narita et al. . |
| 5,396,072 | 3/1995 | Schiebel et al. . |
| 5,436,101 | 7/1995 | Fender et al. . |

FOREIGN PATENT DOCUMENTS

| | | | |
|---|---|---|---|
| 0573199 | 12/1993 | European Pat. Off. ..... | G03G 15/044 |
| 0574690 | 12/1993 | European Pat. Off. .......... | G01T 1/24 |

OTHER PUBLICATIONS

Database WPI Section Ch, week 9225, Derwent Publications Ltd., Class G08, AN 92–203175 XP002049821.

*Primary Examiner*—Jerome Jackson, Jr.
*Attorney, Agent, or Firm*—George J. Primak

[57] ABSTRACT

A multilayer plate for X-ray imaging is provided, which includes a substrate, a biasing electrode and a selenium-based membrane sandwiched between the substrate and the biasing electrode. The selenium-based membrane comprises a thick photoconductive layer of doped amorphous selenium and one or two thin buffer layers. One of the buffer layers is an amorphous arsenic triselenide layer positioned between the photoconductive layer and the substrate, and the other buffer layer is a unipolar conducting layer of alkali doped selenium positioned between the photoconductive layer and the biasing electrode. Preferably both layers are included. A method of producing such multilayer plates is also disclosed.

26 Claims, 10 Drawing Sheets

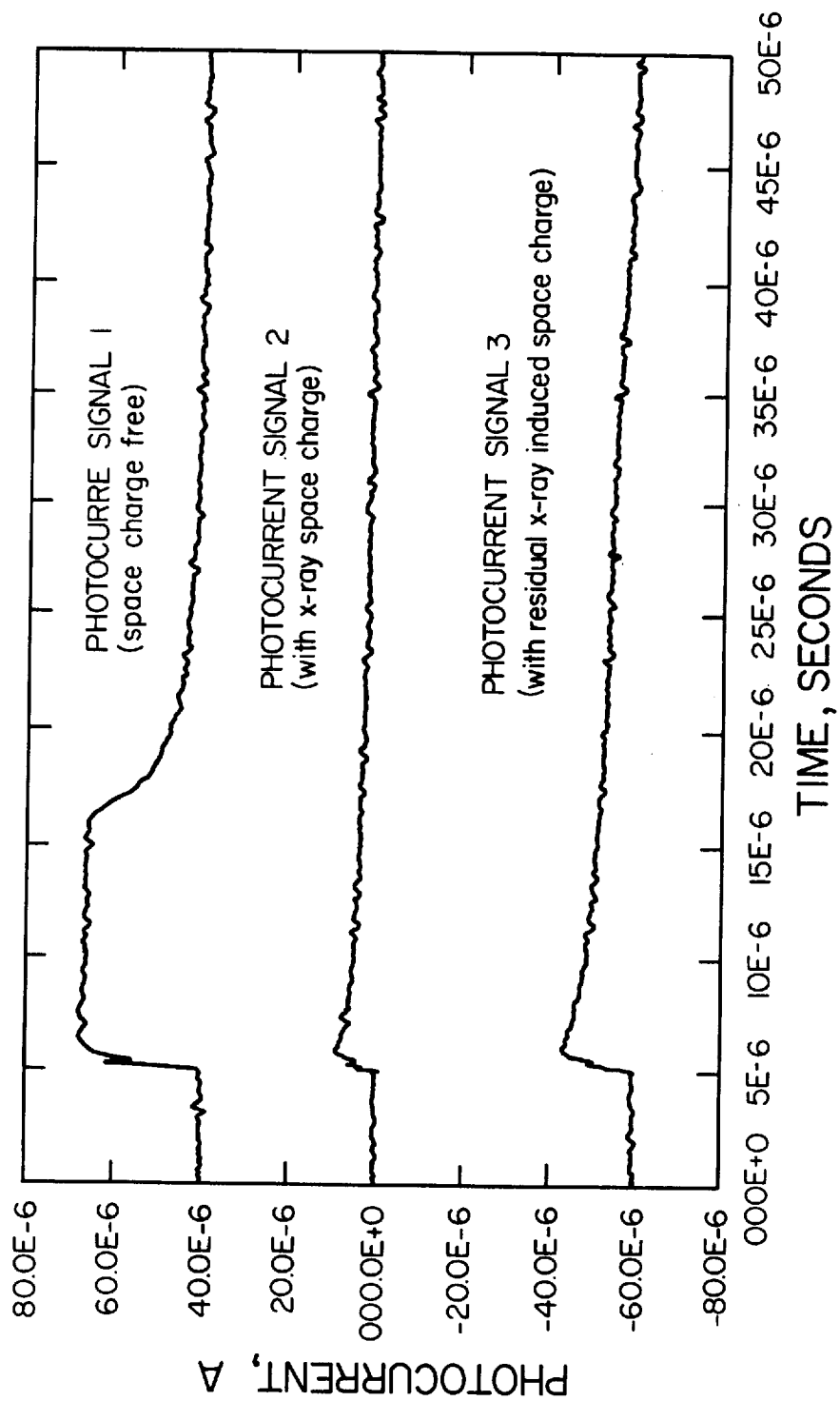
Fig. 5(a)-Prior Art

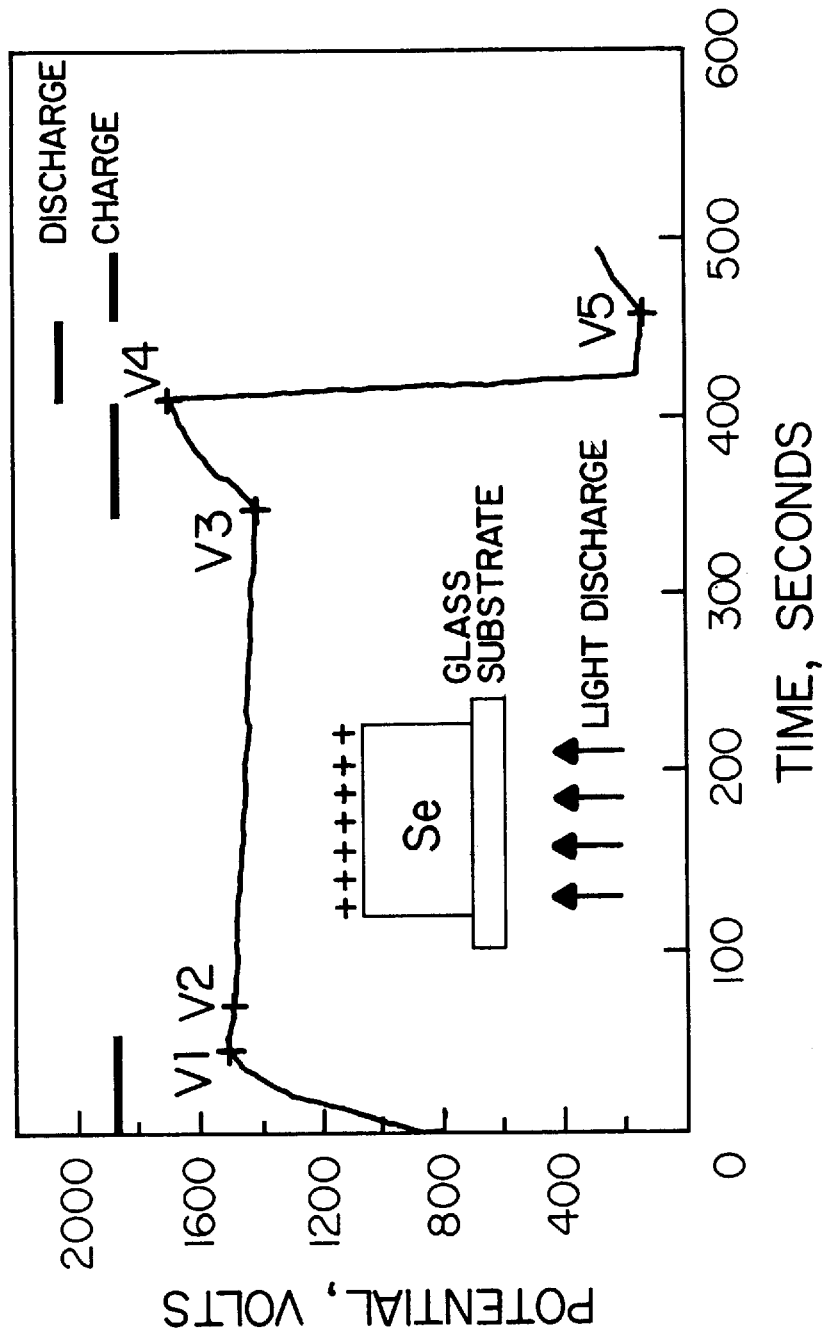
Fig. 6(a) - Prior Art

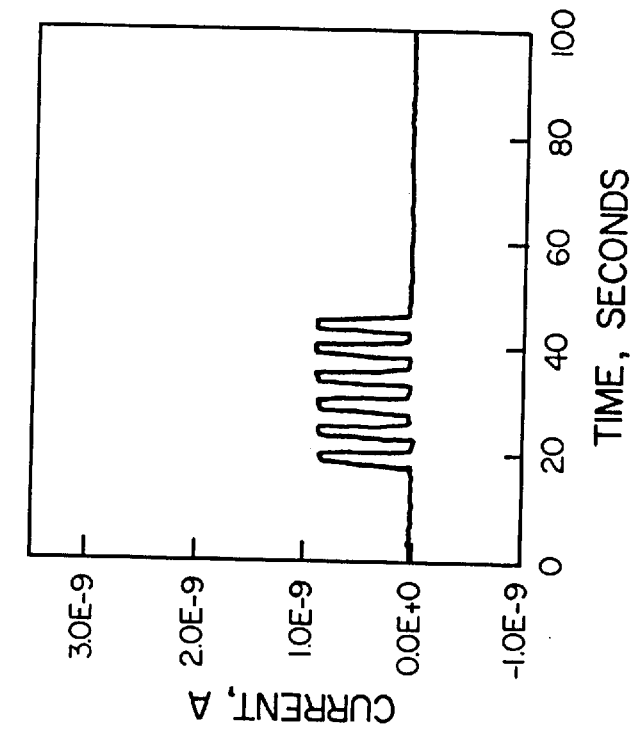
Fig. 8(b)
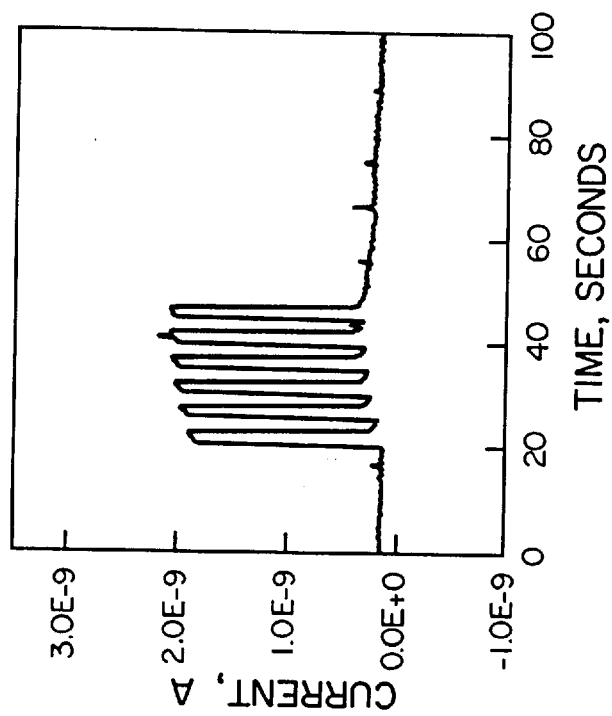
Fig. 8(a) - Prior Art

MULTILAYER PLATE FOR X-RAY IMAGING AND METHOD OF PRODUCING SAME

BACKGROUND OF THE INVENTION

1. Field of the Invention

The present invention relates to an improved multilayer plate for X-ray imaging and to a method for producing such plate, used for converting X-rays into a latent electrostatic image. This latent electrostatic image can subsequently be read out by various schemes, such as by a scanning laser beam, a microcapacitor active matrix panel, or a bank of electrostatic probes.

2. Description of the Prior Art

It is already known to produce multilayer X-ray imaging plates which are sometimes referred to as xeroradiographic plates.

For example, U.S. Pat. No. 3,975,635 of Aug. 17, 1976 discloses a xeroradiographic plate consisting of a conductive backing having thereon a photoconductive layer of selenium and an intermediate layer of an alloy comprising about 15–45 wt % of arsenic and 55–85 wt % of selenium, which intermediate layer has a thickness of about 15–150 $\mu$m and is used to reduce the capacitance of the structure with the result that images are obtained which are capable of development at lower fields without substantial loss of resolution.

U.S. Pat. No. 4,286,033 of Aug. 25, 1981 discloses a multilayer inorganic photosensitive device which comprises a number of various layers, one of which is a hole trapping layer consisting of a halogen doped selenium arsenic alloy wherein the amount of selenium ranges from 95–99.9 wt %, the amount of arsenic ranges from 0.1 to 5 wt % and the amount of halogen is from 10–200 ppm (parts per million). This hole trapping layer has a thickness of 0.01–5 $\mu$m (microns), and is used to retain positive charges at the interface between the generating layer and the overcoating insulating layer, thereby improving image quality.

U.S. Pat. No. 4,338,387; of Jul. 6, 1982 relates to an overcoated photoreceptive device containing a layer of electron trapping material and a hole trapping layer, these layers being comprised of a halogen doped selenium arsenic alloy wherein the amount of selenium is about 95–99.9 wt %, the amount of arsenic is between 0.1–5 wt % and the amount of halogen is from 10 ppm to 200 ppm.

U.S. Pat. No. 4,770,965 of Sep. 13, 1988 discloses a selenium alloy imaging member suitable for X-ray imaging, which is characterized by providing on the Se alloy layer a thin protective organic overcoating layer having about 0.5–3 wt % of nigrosine. This is claimed to result in a greater resolution at a significantly reduced X-ray dosage. In this U.S. Pat. No. 4,770,965, the concept of using intermediate polymer adhesive primer layers between the selenium layer and the metal oxide surface is also disclosed. However, these polymer layers have high thermal expansion coefficients and are not effective in reducing the shear stress due to different thermal expansion of the various layers in the device and may result in film cracking.

In U.S. Pat. No. 4,891,290 of Jan. 2, 1990 there is disclosed a multilayer photosensitive material for electrophotography, (rather than x-ray imaging) wherein a high surface hardness is obtained by providing a surface protective layer of an arsenic-selenium alloy having a composition of approximately $AS_2Se_3$. Such photosensitive material has a high printing resistance. It is also indicated that such photosensitive material may include a buffer layer comprising an arsenic-selenium alloy disposed between the surface protection layer and the charge generation layer which allows for high temperature operation. It should be noted that in electrophotography, to which this U.S. patent relates, the toner particles are mechanically cleaned between images, whereas in digital X-ray imaging there is no mechanical abrasion of the surface and thus a high surface hardness in not required.

In U.S. Pat. No. 4,990,419 of Feb. 5, 1991 assigned to Fuji Electric Co. Ltd., a multilayer electrophotographic photoreceptor is again disclosed, which comprises an $As_2Se_3$ carrier transport layer, a 30 to 50 wt % Te-Se alloy carrier generation layer and an $As_2Se_3$ surface protection layer as well as an outer layer of a transparent insulating material and in U.S. Pat. No. 5,021,310 of Jun. 4, 1991 also assigned to Fuji Electric Co. Ltd. a further thermal expansion relieving layer comprising arsenic and selenium is provided within the photoreceptor. It is stated in this patent that the As concentration of the thermal expansion relieving layer varied from 10 wt % to 38.7 wt % and its overall thickness was 1 $\mu$m. A surface protective layer of $As_2Se_3$ containing 1000 ppm of iodine was deposited thereon to a thickness of 3 $\mu$m. Again, this patent relates to an electrophotographic photoreceptor, rather than to an X-ray imaging device.

According to U.S. Pat. No. 5,023,661 of Jun. 11, 1991, it has been determined that a fatigue artifact is caused by a defect in the xeroradiographic plate in the form of a selenium crystallite at the lower surface of the selenium layer of the plate, which allows positive charges in the form of holes, to enter the selenium layer from the aluminum base during the transfer step. These are often called "catastrophic spot producing artifacts", and the U.S. patent provides a process for eliminating such artifacts by pre-charging the detector after a thermal relaxation step to eliminate the trapped space charge in the device.

In U.S. Pat. No. 5,320,927 of Jun. 14, 1994 the technology for manufacturing an improved selenium alloy X-ray imaging member on a transparent substrate is examined, wherein a bulk selenium arsenic material containing 0.1 to 0.6 wt % As is evaporated onto said substrate in a controlled fractionation process and the evaporation is discontinued when the weight of the selenium alloy remaining in the boat is 2–10% of the original weight. This patent also teaches the use of a selenium arsenic alloy (1–24% As) between the X-ray absorbing material and the substrate material to reduce the crystallite-induced defects. However, this patent fails to address the issue of mechanical stability of the photoreceptor as well as the space charge neutralization capability of the structure.

In U.S. Pat. No. 5,330,863 of Jul. 19, 1994 a photosensitive material for use in electric photography is disclosed wherein carrier injection preventing layers consisting of selenium/arsenic/sulphur alloy are inserted between the conductive substrate and the carrier transport layer or between the carrier generation layer and the overcoat layer, or between both. This makes the photosensitive material resistant to friction, heat, dark decay and fatigue and exhibits little deterioration under high temperature environments. This patent does not relate to X-ray imaging.

In U.S. Pat. No. 5,396,072 of Mar. 7, 1995 a fairly complex X-ray image detector is disclosed, which comprises a plurality of X-ray sensitive sensors each of which has a collecting electrode, a reference electrode and a switching element which connects the collecting electrode to an output lead; a photoconductor layer is provided between the individual collecting electrodes and a bias electrode; and each of the collecting electrodes comprises two electrically contacting electrode portions arranged and situated in a very specific manner, so that the majority of the charge carriers generated in the photoconductor flow to the collecting electrodes.

In U.S. Pat. No. 5,436,101 of Jul. 25, 1995 an X-ray photoreceptor is disclosed which has a high arsenic interstitial layer 5–40 μm in thickness sandwiched between the substrate and the selenium layer for trapping positive charges injected from the interface. This structure was designed to prevent rather than promote hole injection from the substrate material into the photoreceptor device.

It should be noted that the concept of using multilayer structures based on amorphous selenium alloys (a-Se alloys) originated in the electrophotographic or xerographic industry (see, for example, U.S. Pat. No. 3,041,166 of Jun. 26, 1962) in an effort to make the spectral response of the photoreceptor more panchromatic to compete with the lower cost organic photoreceptors. For example, alloying of Se with about 40 atomic % Te has been shown to decrease the effective optical band gap of selenium from 2.2 eV down to about 1.2 eV. However, this increased longer wavelength photosensitivity generally occurs at the expense of electrophotographic properties—high residual potentials and rapid dark decays being typical of this class of materials. In fact, the electrophotographic properties of a-$Se_xTe_{1-x}$ materials, particularly when the Te content is high, generally preclude the use of these materials in monolayer photoreceptor applications. Since photoreceptors require both low residuals, wide panchromicity (especially for laser printer applications, where low cost semiconductor lasers emit light in the long wavelength regime), and low dark decay, considerable effort was placed into decoupling the photogeneration process and the charge transport process in the device. $Se_xTe_{1-x}$ alloys were used to absorb the light, but since the xerographic properties of this material were not optimal, a second charge transport layer was used to achieve the desired electrophotographic properties.

As is obvious from the various prior art patents referred to above, multilayer selenium based structures have also been employed for higher energy X-ray imaging applications. One of the earliest commercial applications of selenium to X-ray imaging was in xeroradiography, where the detector consisted of a selenium layer deposited onto an aluminum plate. In a typical imaging cycle, the plate was sensitized by corona charging, exposed to the patient modulated X-ray beam to selectively discharge the selenium, and then developed by passing triboelectrically charged toner particles across the selenium plate, transferring the toner particles to paper, and finally fixing the image by heating the paper. Before the next image could be taken, the selenium plate had to be cleaned from all residual toner particles (generally by mechanical brush), and then restored to a "neutral space charge" condition. The multilayer structures used in optical imaging applications and those used in X-ray imaging applications are not interchangeable and have acquired separate status within the relevant art as is obvious from the prior art patents discussed above.

Furthermore, within the X-ray imaging itself there are two distinct modes of imaging, namely the static mode and the dynamic mode which may be defined as follows:

Static Mode Imagine

In the static mode imaging, images can only be taken at a relatively low frequency, e.g. 1 image every 20 seconds, and the X-ray beam is pulsed. As such, there is sufficient time to neutralize any space charge which accumulates in the device between images.

Dynamic Mode Imaging

In the dynamic mode imaging, images are taken at a much higher frequency, e.g. 30 images per second, and the X-ray beam is left on during the entire examination. In this case, there is no time to remove the applied bias voltage between images to allow holes to be injected from the bottom buffer layer into the bulk X-ray absorbing layer to neutralize the negative space charge.

Although the above discussed prior art indicates that a considerable amount of work is being done in the area of optical and X-ray imaging technologies, until now, selenium based X-ray detectors have suffered from the presence of polycrystallites in the selenium layer located near the substrate. The presence of such polycrystallites is undesirable in X-ray imaging applications, since it could lead to spurious charge injection sites and in the extreme case to a loss of the imaging capabilities for X-ray imaging detectors where the latent electrostatic image is read from the substrate. The manufacturing process window for producing a layer which is free of polycrystallites at the interface while simultaneously keeping the bulk properties of the amorphous selenium layer at their optimal value is extremely narrow.

Furthermore, until now selenium-based X-ray detectors have suffered from thermal shocks which often lead to the physical delamination of the selenium film from the substrate due to the stress resulting from the mismatched thermal expansion between the bulk amorphous selenium layer and typical substrate materials such as glass and aluminum.

Moreover, prior art selenium based X-ray detectors have suffered from the availability of a limited number of materials which could be used as the substrate electrode material. For example, aluminum has been widely used because of its high oxidation potential and hence its ability to form a high-quality uniform aluminum oxide layer to prevent electron injection from the substrate into the bulk of selenium. Another example is Indium Tin Oxide (ITO) coated glass which has shown some electron blocking characteristics at the ITO selenium heterojunction.

However, known detectors do not normally allow the use of a wide variety of substrate materials because they rely on the electrochemical interaction between the materials to create the required electron blocking characteristic.

In addition, prior art selenium-based X-ray detectors have suffered from memory effects induced by the accumulation of negative space charge in the doped selenium layer. Laborious erasing schemes utilizing a combination of light, temperature and voltage polarization cycles were necessary to erase the accumulated space charge. In the case of opaque substrate materials, this prohibits the use of light in the erasure sequence.

Finally, known selenium-based X-ray detectors have suffered from difficulties in applying the high voltage bias across the doped amorphous selenium layer. This problem was handled by either corona charging the device or by inserting insulating materials such as polycarbonate, polyester, parylene or glass between an upper electrode and the doped amorphous selenium layer to prevent spurious hole injection from the electrode into the selenium layer. None of these approaches allow for imaging at fluoroscopic rates (30 images/second).

OBJECTS AND SUMMARY OF THE INVENTION

It is an object of the present invention to provide a multilayer plate for X-ray imaging and a method of its manufacture which will obviate the disadvantages of the prior art.

Another object of the invention is to provide an improved X-ray imaging multilayer membrane which can be used in a variety of X-ray imaging technologies, including medical and non-destructive testing applications.

Other objects and advantages of this invention will become apparent from the following description thereof.

In essence, the multilayer plate for X-ray imaging in accordance with the present invention comprises:

(a) a substrate, which may be of any desired type;

(b) a biasing electrode, which also may be of any suitable type; and (c) a selenium based membrane sandwiched between said substrate and said biasing electrode, said membrane comprising a thin interstitial buffer layer of amorphous arsenic triselenide which will normally have a thickness of between about 0.5 $\mu$m and 10 $\mu$m, preferably between about 1 $\mu$m and 5 $\mu$m, and a thick photoconductive layer of doped amorphous selenium which will normally have a thickness of between about 100 $\mu$m and 2 mm, preferably between about 200 $\mu$m and 500 $\mu$m, said interstitial buffer layer being itself sandwiched between said substrate and said photoconductive layer.

The interstitial buffer layer mentioned above is essential for the static mode X-ray imaging because the charge neutralization in this mode is accomplished by the injection of holes from the bottom interstitial buffer layer into the X-ray absorbing photoconductive layer when the applied bias voltage is removed, This amorphous arsenic triselenide (a-$As_2Se_3$) bottom layer allows "self-reconditioning" of the plate and has other intrinsic advantages, such as being electron blocking and adhesion promoting during the thermal cycling of the device.

In another embodiment of the invention, there is provided a multilayer plate for X-ray imaging, which comprises:

(a) a substrate, which again may be of any desired type;

(b) a biasing electrode, which will normally consist of a thin layer of conductive material, such as a metal film; and (c) a selenium based membrane sandwiched between said substrate and said biasing electrode, said membrane comprising a thin unipolar conducting buffer layer made of alkali doped selenium, which will normally have a thickness of between about 0.5 $\mu$m and 10 $\mu$m, preferably between about 1 $\mu$m and 5 $\mu$m, and a thick photoconductive layer of doped amorphous selenium which will normally have a thickness of between about 100 $\mu$m and 2 mm, preferably between about 200 $\mu$m and 500 $\mu$m, said unipolar conducting buffer layer being itself sandwiched between said biasing electrode and said photoconductive layer.

The unipolar conducting buffer layer mentioned above is essential for the dynamic mode imaging because it is designed to minimize any excess charge injection from the top electrode into the bulk material until the charge carriers generated by the X-ray beam neutralize the space charge in the device. In such dynamic mode, the biasing electrode will not comprise a layer of insulating dielectric material as in the case of the static mode, but will consist solely of a thin layer of conductive material applied over the unipolar conductive buffer layer. It is preferred that also in this case there be provided the interstitial bottom buffer layer of amorphous arsenic triselenide already mentioned above to impart the additional advantages, such as blocking of electrons and buffering the differential thermal expansion between the substrate and the bulk absorbing layer.

Thus, according to the most preferred embodiment of the present invention, there is provided a multilayer plate for X-ray imaging, which comprises:

(a) a substrate, which again may be of any desired type;

(b) a biasing electrode, which also may be of any suitable type; and (c) a selenium based membrane sandwiched between said substrate and said biasing electrode, said membrane essentially consisting of a thin interstitial buffer layer of amorphous arsenic triselenide, a thick photoconductive layer made of doped amorphous selenium and a thin unipolar conducting buffer layer made of alkali doped selenium, said photoconductive layer being itself sandwiched between said buffer layers with the interstitial buffer layer being positioned between said photoconductive layer and the substrate, while the unipolar conducting buffer layer being positioned between said photoconductive layer and the biasing electrode.

The layered plate structures of the present invention allow conversion of X-rays into a latent electrostatic image that can subsequently be read out by various schemes. For example, such image can be read by a scanning laser beam, a microcapacitor active matrix panel or a bank of electrostatic probes.

In the preferred embodiment mentioned above, the doped amorphous selenium layer is used to absorb and convert the incident X-ray energy into electrical charges, whereas the buffer layers are used to increase the compatibility of the structure to a wide variety of detector configurations, thereby making this invention generic to any direct conversion X-ray imaging systems.

The present invention also includes a method of manufacturing an X-ray imaging plate, which comprises:

(a) providing a substrate;

(b) depositing on said substrate a thin film of amorphous arsenic triselenide by thermally evaporating doped arsenic triselenide material under reduced pressure of less than $1\times10^{-5}$ torr and condensing the resulting vapour onto the substrate to form a uniform amorphous layer of $As_2Se_3$;

(c) depositing on said thin film of amorphous arsenic triselenide a thick photoconductive film of doped amorphous selenium by evaporating a doped amorphous selenium material and condensing the resulting vapour onto said thin film of amorphous arsenic triselenide; and (d) laminating or coating onto the thick photoconductive film an insulating dielectric layer and providing on top of said insulating dielectric layer a thin layer of conductive material, said insulating dielectric layer and said layer of conductive material constituting a biasing electrode.

In a preferred embodiment, the method further comprises depositing on said photoconductive film a thin film of alkali doped selenium by evaporating an alkali doped selenium alloy or simultaneously co-evaporating Se and alkali material and condensing the resulting vapour onto the photoconductive film, and thereafter forming the biasing electrode on top of said thin film of alkali doped selenium.

If, in a dynamic mode imaging situation, the bottom thin film of a-$As_2Se_3$ is not required, one may only deposit the alkali doped selenium layer onto the photoconductive film and thereafter form the biasing electrode on top of said layer, which will consist of a thin layer of conductive material, such as a metal film.

When reference is made to the thin interstitial buffer layer or film of amorphous arsenic triselenide, it should be understood that it is normally formed by thermally evaporating doped arsenic triselenide material the composition of which contains about 34–38 wt % As and includes dopants such as iodine, indium or gallium in parts per million concentrations, and thus the a-As$_2$Se$_3$ film also normally contains such dopants.

The second thin buffer layer or thin film referred to as a unipolar conducting buffer layer also may include arsenic in the 0.5–5 wt % range as well as an alkali element, such as Li, K, Na and H in the 1–1000 ppm concentration or some combination thereof.

The thick photoconductive layer of doped amorphous selenium is conventional and is normally made of amorphous selenium doped with arsenic and chlorine. For example, it may contain 0.2% As and 10 ppm Cl.

The amorphous arsenic triselenide interstitial buffer layer used in accordance with the present invention provides a wide process window inasmuch as the tendency for a-As$_2$Se$_3$ layer to crystallize is much less than that of the doped selenium layer. Moreover, the arsenic triselenide buffer layer has the ability to reduce the stress resulting from the mismatched thermal expansion between the bulk amorphous selenium layer and typical substrate materials such as glass and aluminum. Furthermore, the amorphous arsenic triselenide buffer layer allows a wide variety of substrate materials to be used since it divorces the electronic properties of the substrate from the doped selenium layer and does not rely on the electrochemical interaction between the materials to create the electron blocking characteristic, because of the inability of electrons to traverse even a very thin (0.5–10 $\mu$m) layer of a-As$_2$Se$_3$ biased to high electric fields in excess of 15V/$\mu$m.

Another important feature of this invention is the ability of the amorphous arsenic triselenide layer to inject a sufficient amount of positive space charge into the doped amorphous selenium layer to restore space charge neutrality when the applied bias is removed from the detector.

A still further key element of this invention is to provide a hole blocking layer also called a unipolar conducting buffer layer directly deposited on the doped amorphous selenium layer prior to deposition of any conducting metal electrode such as indium, gold, aluminum, chromium or ITO (indium tin oxide). This hole blocking layer must be unipolar in nature for trapping holes injected from the upper electrode, but conducting electrons generated from X-rays in the doped amorphous selenium layer to prevent the accumulation of a negative space charge in the device.

As already mentioned above, in the most preferred embodiment of the invention, both of the above described buffer layers are used within the x-ray imaging plate.

BRIEF DESCRIPTION OF THE DRAWINGS

A preferred embodiment of the invention will now be described with reference to the appended drawings in which:

FIG. 2($b$) is a cross-sectional view of another experimental prototype used for comparison purposes;

FIG. 5($b$) illustrates comparative hole transient photoconductivity waveforms of an X-ray imaging plate according to the present invention;

FIG. 6($b$) illustrates comparative photoinduced discharge measurements to demonstrate the electron blocking efficiency of the novel X-ray imaging plate;

FIG. 8($a$) illustrates the total current as a function of time for a device such as shown in FIG. 2($b$) without buffer layer 22; and FIG. 8($b$) illustrates the total current as a function of time for a device such as shown in FIG. 2($b$) with buffer layer 22.

DETAILED DESCRIPTION OF THE INVENTION

Figure 1:
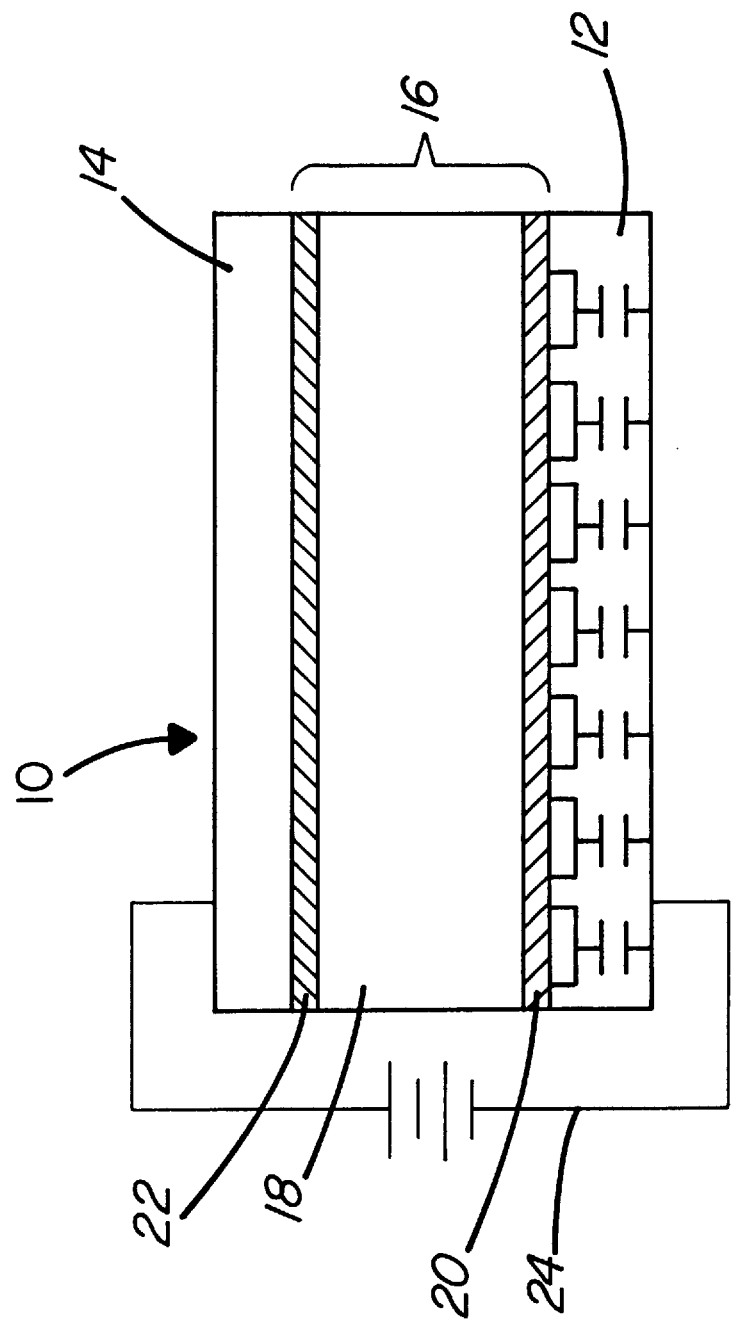
FIG. 1 is a cross-sectional view of the multilayer X-ray imaging plate on an enlarged scale.

In FIG. 1 the most preferred embodiment of the present invention is illustrated. It shows a multilayered plate 10 which comprises a substrate 12 which, in this case, is shown to be a TFT matrix (thin film transistor), and a biasing electrode 14 which is made of a high voltage biasing structure capable of withstanding voltages in excess of 500 volts. A selenium based multilayered membrane 16 is sandwiched between the substrate 12 and the biasing electrode 14. The substrate 12 can be any desired substrate, such as aluminum, glass, a thin film transistor array, a charged coupled device (CCD) and a complementary metal oxide semiconductor device (CMOS).

In accordance with the preferred embodiment of the present invention illustrated in FIG. 1, this membrane comprises an energy absorbing and converting layer 18 which is also called a photoconductive layer and which is made of doped amorphous selenium. Layer 18 is a thick film normally having a thickness of between about 100 $\mu$m and 2 mm, preferably between about 200 $\mu$m and 500 $\mu$m, and is generally known in the art. This layer 18 is itself sandwiched between two thin buffer layers 20 and 22 (usually between about 0.5 $\mu$m and 10 $\mu$m thick) which are the gist of the present invention.

As already mentioned, the invention could include only buffer layer 20 or only buffer layer 22 within the structure such as shown in FIG. 1, but in the most preferred embodiment it includes both of these buffer layers.

Finally, there is provided an electrical connection 24 between the substrate 12 and the biasing electrode 14 to impart the required high voltage during the operation of the device.

The doped amorphous selenium layer will have properties, such as X-ray absorption, charge generation, charge transport and dark discharge optimized to suit a given X-ray imaging requirement. The amorphous arsenic triselenide (a-As$_2$Se$_3$) interstitial buffer layer 20 sandwiched between the doped amorphous selenium layer 18 and the substrate 12 was surprisingly found to have properties that make the structure of the novel multilayer plate mechanically stable by promoting strong adhesion between the substrate 12 and the selenium layer 18. This buffer layer also allows the structure to recondition itself without difficulty and, moreover, significantly increases the manufacturing process window in which crystallization is avoided.

The second buffer layer 22, sandwiched between the amorphous selenium layer 18 and the biasing structure 14, is a unipolar conducting buffer layer made of alkali doped selenium. This layer 22 is designed such that the hole carrier range is severely degraded to prevent the injection of holes from the biasing electrode 14 into the bulk selenium layer 18, without altering significantly the electron conduction properties of this layer. This alkali doped selenium buffer layer 22 may also include arsenic in the amount of 0.5–5 wt %.

Figure 2B:
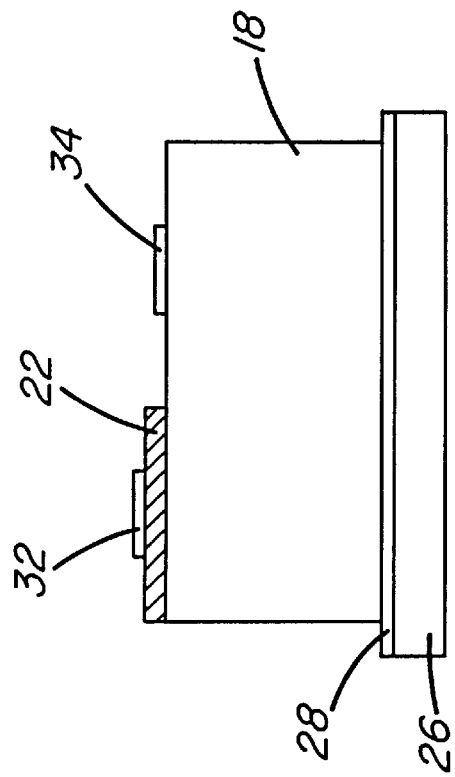
FIG. 2($a$) is a cross-sectional view of an experimental prototype used for comparison purposes.
Figure 2A:
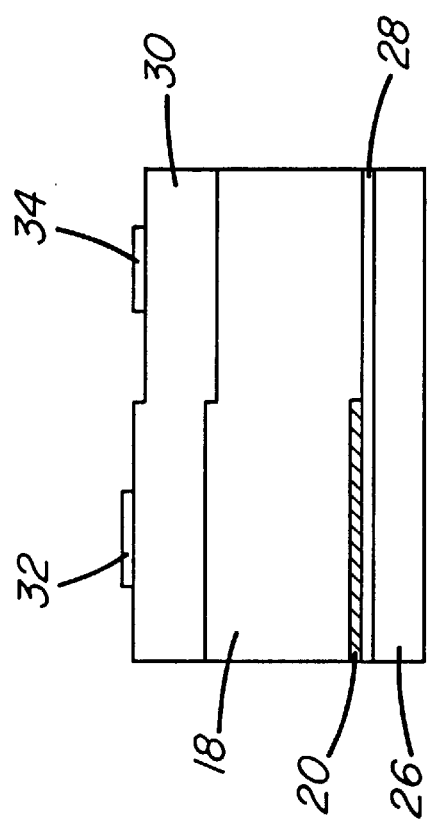

FIG. 2(a) illustrates a cross section of test devices that were built to approximate reduced size X-ray detectors, and specifically to verify the advantages of the present invention. The same reference numbers as in FIG. 1 are used to identify the same elements. As shown in FIG. 2(a), a glass Corning 7059™ substrate 26, 1.1 mm thick, was coated with a conductive transparent indium tin oxide (ITO) layer 28 known as Baltracon™ and supplied by Balzers. For the sake of comparison, half of the substrate was masked off prior to the evaporation of the amorphous arsenic triselenide layer 20. A thin film of a-$As_2Se_3$, having a thickness of 3 μm, was formed by thermally evaporating the doped arsenic triselenide material under reduced pressure of less than $1\times10^{-5}$ torr. The composition of the precursor material was 34–38 wt % As, and included other dopants, such as iodine, indium or gallium in parts per million concentration. The material was evaporated from a stainless steel 304 boat which was held at a temperature ranging from 350°–450° C. The doped arsenic triselenide vapour was condensed onto the portion of the substrates 26, 28 provided for it and held at a temperature between 30° and 190° C. Under the above conditions, a uniform, amorphous, pin-hole free buffer layer was obtained over the half of the substrate which was not masked. The doped amorphous selenium layer 18 between 200 and 500 μm thick, which serves herein as the X-ray energy absorbing and charge converting layer, was then evaporated from a second stainless steel boat held between 230° and 280° C. onto the above substrates after the mask was removed. The temperature of the substrates was held constant between 50° and 90° C. during the deposition of this second layer. An insulating dielectric layer 30 of a thickness between 30 and 150 μm, for example of polycarbonate, polyester or parylene, was then laminated or coated onto the amorphous selenium photoconductive layer. The prototype configuration was then completed by evaporating a thin (10–50 nm) transparent conductive material such as gold, platinum, aluminum or indium tin oxide in a patterned form onto the dielectric material to create two independent electrodes 32, 34. These top electrodes were deposited in locations such that a comparative analysis could be performed to illustrate the role of the amorphous arsenic triselenide buffer layer 20 with reference to the prior art.

In a further embodiment of the present invention, illustrated in FIG. 2(b), an arsenic and sodium doped selenium alloy buffer layer 22 was evaporated onto the doped amorphous selenium thick film 18 on the same half of the substrate as layer 20 in FIG. 2(a) which itself was omitted. This was done from a stainless steel boat held at a temperature between 230° and 270° C. The substrate temperatures during this evaporation were held between 50° and 80° C. No dielectric insulating layer 30 was needed in this case and only the two independent electrodes 32, 34 were provided.

To illustrate the first key element of this invention relating to the reduction of interfacial crystallization, the samples as prepared above in FIG. 2(a) were analyzed by infra-red microscopy techniques. The results from this study showed that the inclusion of the amorphous arsenic triselenide layer 20 greatly reduced the microcrystallites which normally grow at the interface between the selenium layer 18 and the substrate materials 26, 28 (or 12 in FIG. 1) during the deposition of the doped amorphous selenium layer in detectors fabricated in accordance with the prior art. With the presence of an amorphous arsenic triselenide layer 20, in this case having a thickness of 3 μm, no evidence of any crystallites could be observed, while on the other side of the detector, with no buffer layer, severe crystallization was observed at the interface. This key element of the invention leads to a superior performing X-ray detector, void of any crystallite-induced imaging artifacts.

Figure 3A:
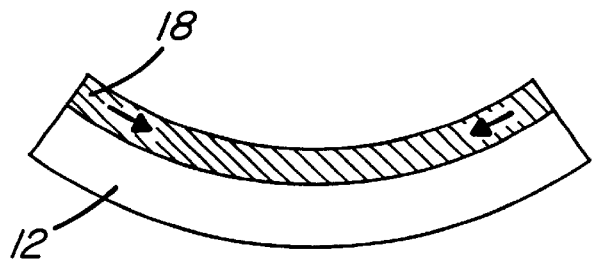
FIGS. 3($a$) tio 3($e$) illustrates various failure mechanisms at the selenium substrate interface when it is stressed.
Figure 3B:
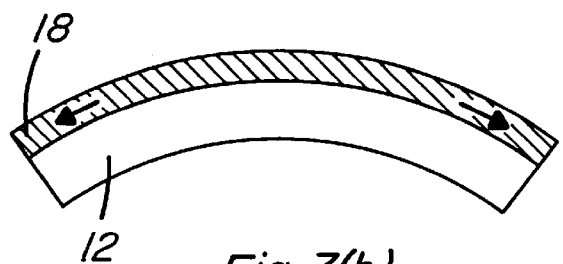
Figure 5B:
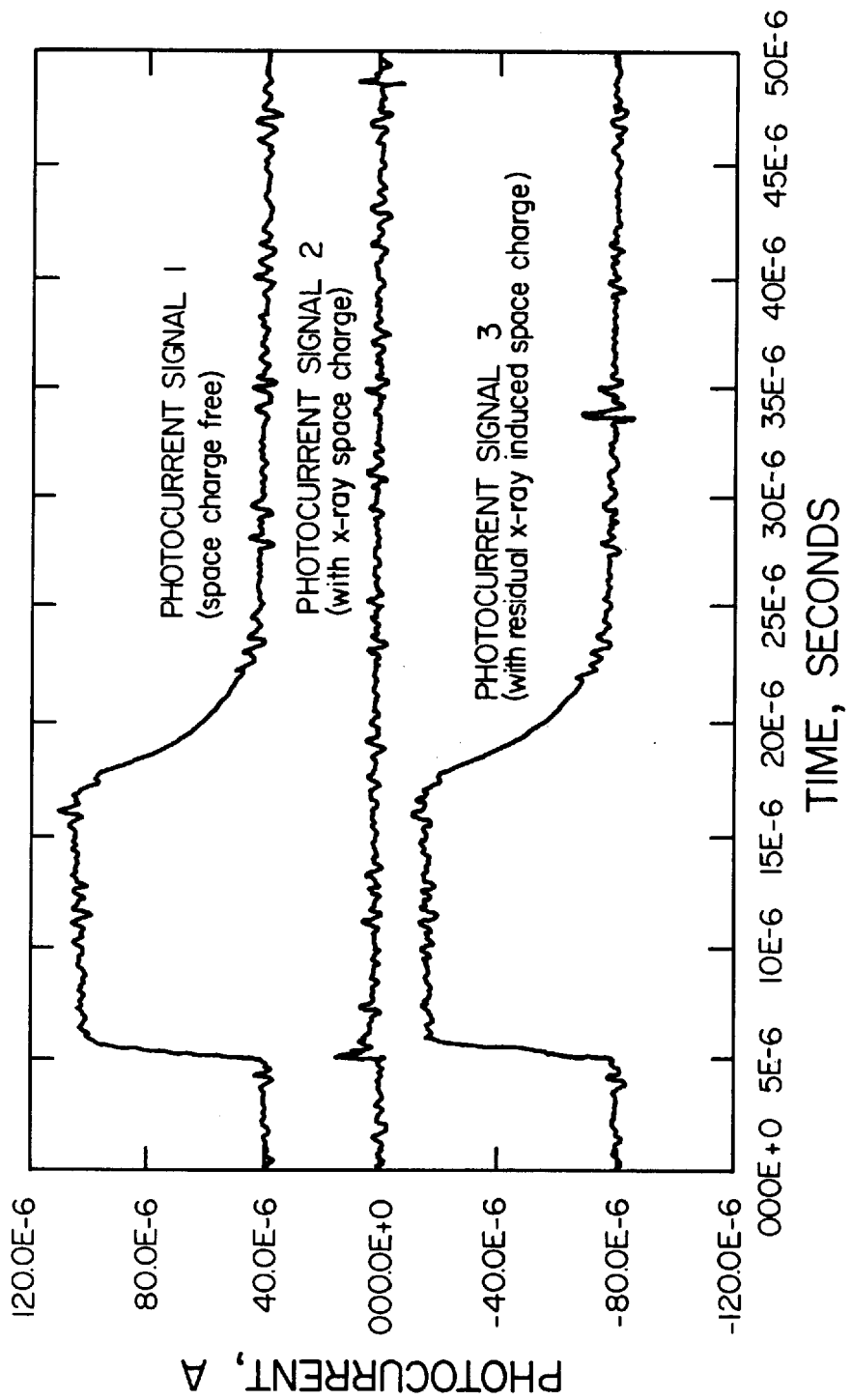
FIG. 5($a$) illustrates hole transient photoconductivity waveforms of a conventional X-ray imaging plate.

Another important element of this invention provides for improved mechanical stability of the novel multilayered X-ray detector or plate. Such detector may, under special circumstances, such as shipping during cold weather conditions, be subjected to temperature cycling. Prior to this invention, temperature cycling seriously affected the mechanical integrity of the device due to a mismatch in the thermal expansion coefficients of the substrate material and the photoconductive selenium layer. Physical delamination of the selenium layer or selenium film breakage would sometimes occur. FIGS. 3(a) and 5(b) illustrate in (a) and (b) how the selenium substrate interface may be stressed by differential thermal expansion upon cooling (tensile stress) or heating (compressive stress) of the device. Thus, in of FIG. 3(a) an illustration is provided how the interface between substrate 12 and doped selenium layer 18 may be subjected to a compressive stress and in FIG. 3(b) to a tensile stress due to temperature cycling.

Figure 3C:
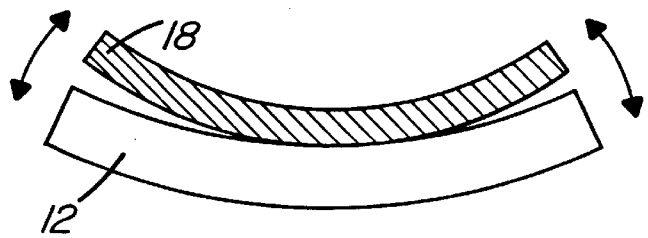
Figure 3D:
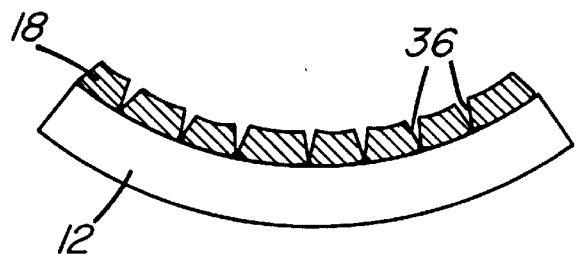
Figure 3E:
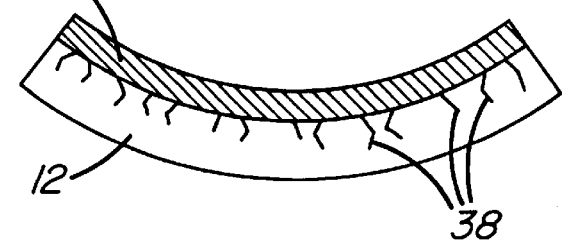

In FIGS. 3(c), 3(d) and 3(e) of FIG. 3 the various failure mechanisms are illustrated, which occur if the shear stress is not reduced. Thus, in FIG. 3(c) a delamination of the doped selenium layer 18 from the substrate 12 is shown, in FIG. 3(d) breaks or cleavages in the doped selenium layer 18, and in FIG. 3(e) cracks 38 occur in the substrate 12 as a result of the stresses shown in FIG. 3(a) and 3(b).

Amorphous selenium layers are known to have very large thermal expansion coefficients, comparable to polymers. On the other hand, materials typically used as substrate materials, for example aluminum or glass, have thermal expansion coefficients much lower than the amorphous selenium. The thermal expansion of selenium-arsenic alloys has been found to be strongly related to the arsenic concentration. The use of an amorphous arsenic triselenide buffer layer decreases the shear stress at the interface inasmuch as the thermal linear expansion coefficient of this buffer layer is more than two times lower than that of the doped amorphous selenium layer and more closely matches that of the substrate material. The impact of this is that the stress is thus transferred from the relatively weak interface between the substrate material and the doped amorphous selenium film to the much stronger interface between the doped amorphous selenium layer and the amorphous arsenic triselenide buffer layer, thereby increasing the film adherence.

Figure 4:
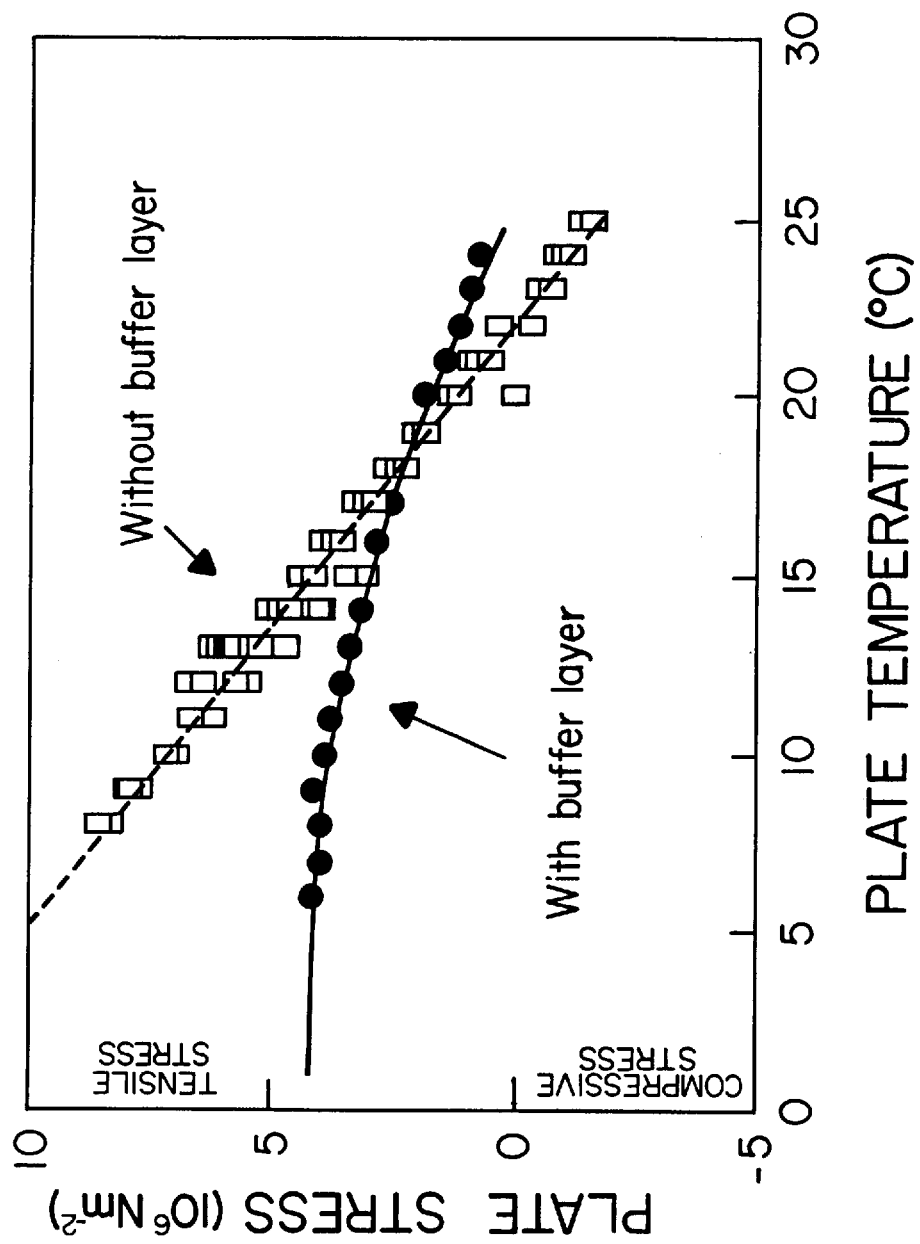
FIG. 4 is a comparative plot of plate stress versus plate temperature for devices such as illustrated in FIG. 2($a$)

In order to illustrate the feature of the present invention relating to the ability of the arsenic triselenide buffer layer to reduce the stress resulting from the mismatched thermal expansion between the thick amorphous selenium layer and the substrate, the following experiment was performed: two test plates were purposively built, one such as shown in FIG. 2(a) including the thin buffer layer 20 of amorphous arsenic triselenide, and the other excluding such buffer layer 20. The deposition process of the various layers has already been described above. Thereafter, these two test plates were subjected to a thermal cycling and a conventional Tencor FLX-2900™ film stress measurement instrument was used to record their respective stress-temperature characteristics. The obtained experimental results plotted in FIG. 4 show that for a given temperature difference, the plate with the buffer layer presents a stress change of about five times lower that of the plate without the buffer layer. This result indicates that the plate with the buffer layer is much less temperature-sensitive. Thus, as far as the mechanical integrity of the plate is concerned (during handling, storage and shipping), the use of the buffer layer would allow the multilayered detector to withstand thermal shocks since the corresponding thermally-induced stress values would be still low enough not to lead to any plate failure mechanisms illustrated in FIGS. 3(c), 3(d) and 3(e).

For selenium-based X-ray imaging systems designed specifically for snap-shot mode of operation, a reconditioning sequence is always required between two successive X-ray image acquisitions, to eliminate the space charge accumulated in the selenium layer which represents the latent electrostatic X-ray image. Prior to this invention, this image erasure step was accomplished through a series of light, bias voltage sequences and sometimes temperature cycling. This external erasure technique is usually cumbersome and time consuming. The present invention provides a multilayered detector structure which is capable of eliminating any residual space charge which accumulates in the doped amorphous selenium layer and thus it is self-reconditioning.

To illustrate this feature of the present invention, a conventional Time-of-Flight Transient Photoconductivity apparatus was used to probe the internal space charge distribution in the prototype sample as described above and shown in FIG. 2(a) after it was subjected to a typical X-ray imaging sequence. In the Time-of-Flight measurement, a high voltage bias was applied across the X-ray detector prototype to generate a uniform electric field within the selenium layer. A short duration (200 picosecond) highly absorbed ($\lambda$=460 nm) light pulse generated from a nitrogen pumped dye laser was focussed on the top metal electrodes 32, 34 of the sample causing the photogeneration of charges near the upper surface of the selenium layer. Due to the polarity of the applied bias voltage, holes were swept to the bulk of the selenium layer causing a measurable current to flow in the external circuit. In the absence of any charge trapping or any perturbation of the internal electric field by space charge, this current should be constant in magnitude until the holes reach the counter bottom electrode, at which time the measured current should abruptly fall to zero.

FIG. 5(a) shows the results on a device which did not include the amorphous arsenic triselenide layer 20, whereas FIG. 5(b) shows the results on a device including this buffer layer. In these figures, when reference is made to E-6, it means the number is to the exponential of -6. The first hole photocurrent waveform shown in FIG. 5(a) and FIG. 5(b) demonstrates the absence of any noticeable space charge in either device after prolong dark resting. Prior to the acquisition of the second hole photocurrent waveform, the devices were X-ray irradiated to simulate an X-ray imaging sequence. The second photocurrent waveforms in FIG. 5(a) and FIG. 5(b) indicate the presence of a significant X-ray induced space charge accumulated at the interface between the selenium layer and the dielectric material in both devices. It should be noted that this space charge would normally represent the latent electrostatic image in an actual X-ray imaging plate. The third hole current waveforms in FIG. 5(a) and FIG. 5(b) were obtained after briefly shorting the upper and bottom electrodes together. The complete restoration of the hole photocurrent waveform to its space charge neutral condition in FIG. 5(b) demonstrates the self-reconditioning capability provided by the amorphous arsenic triselenide layer in accordance with this invention. In marked contrast, the device without the arsenic triselenide layer 20 could not recondition itself as evidenced by the third current hole waveform in FIG. 5(a). The self reconditioning aspect of this invention is caused by the amorphous arsenic triselenide layer 20 which acts like a hole reservoir. When the applied bias voltage is removed across the device, the negative space charge at the selenium/dielectric interface causes the internal field in the selenium layer to actually reverse polarity. This internal field reversal draws-in positively charged holes from the buffer layer 20 until the internal field drops to zero, at which point the device is returned to its space charge neutral state. The hole reservoir effect of the amorphous arsenic triselenide buffer layer 20, which was discovered by the applicants is actually caused by two effects: amorphous arsenic triselenide is a higher conductivity material ($10^{-15}$ $\Omega^{-1}$ cm$^{-1}$), and this increased conductivity is attributed to an increased number of free holes in the material. In addition, the junction between the amorphous arsenic triselenide material and the substrate electrode forms a "finite injector" which can supply enough charge to neutralize the negative space charge.

Figure 6B:
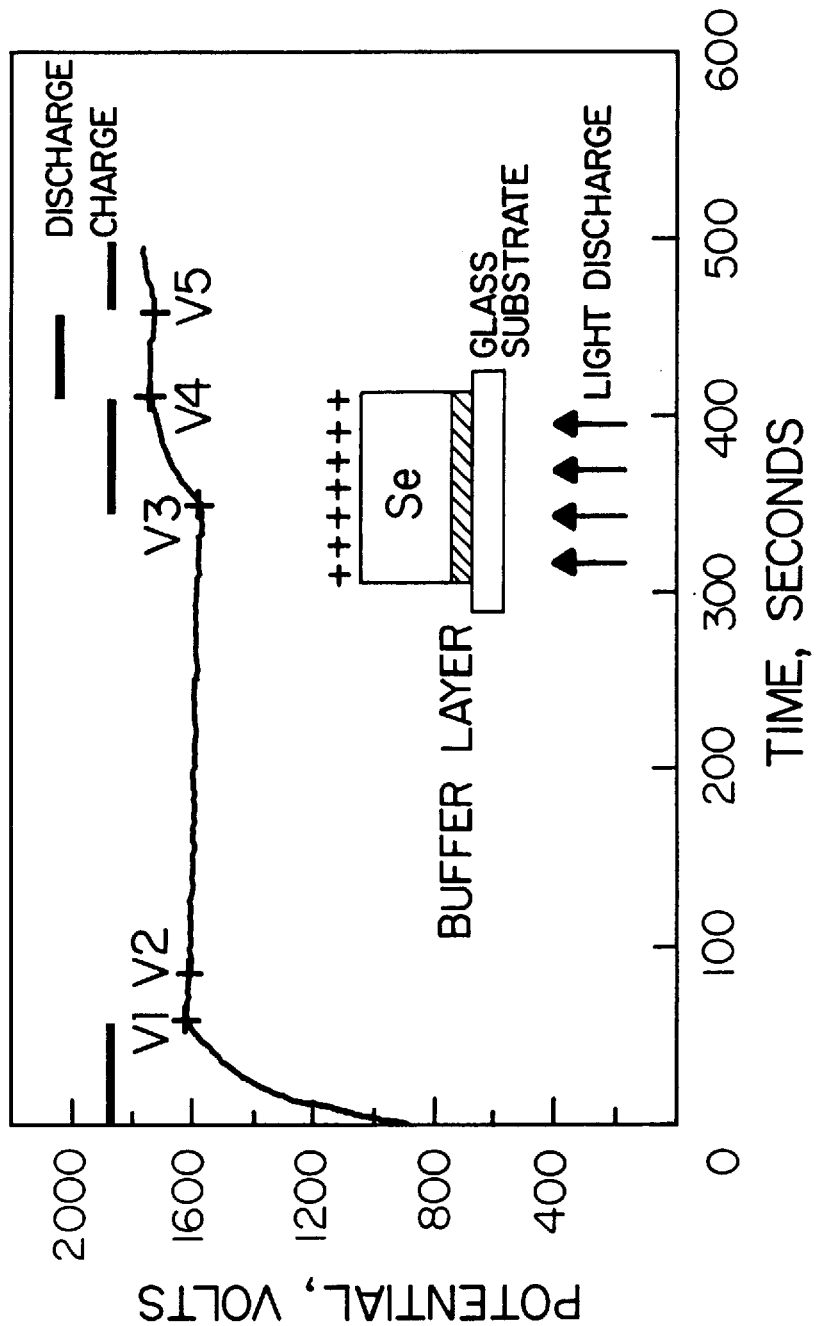
FIG. 6($a$) illustrates photoinduced discharge measurements showing the electron blocking of a conventional X-ray imaging plate.

To illustrate a further important element of this invention, devices were prepared as described above except without the aforementioned dielectric and metal electrode layer. A key feature of a good selenium-based X-ray detector is to exhibit a low dark discharge current when biased to a high electric field. One of the main components of this dark current is electron injection from the conducting substrate material into the bulk amorphous selenium layer. Good detectors must, therefore, be designed to minimize this process. In order to demonstrate this key element of the present invention, test devices were tested xerographically by approximating electron injection from the substrate material through a photogeneration process. The prototype devices were first charged by a corona device so that the bare surface of the selenium layer was biased positively with respect to the substrate. The surface potential of the selenium layer was then monitored by a non-contact electrostatic probe for a period of three hundred seconds to evaluate the dark discharge characteristics of the device. The sample was then recharged by the corona device prior to approximating severe electron injection from the substrate material by illuminating the device through the transparent substrate material. FIG. 6(a) shows the xerographic results on a sample which did not include the amorphous arsenic triselenide layer. Since the surface potential drops drastically during the time where light was illuminated through the substrate due to the transport of photoinjected electrons across the selenium layer, this illustrates that any spurious charge injection from the substrate material into the selenium layer will cause large local dark currents. FIG. 6(b) shows the same xerographic test performed on a prototype device which includes the interstitial arsenic triselenide layer. In this case, however, the illumination of the device by the highly absorbed light did not cause any appreciable discharge of the device despite the fact that the amorphous arsenic triselenide material is photosensitive to the wavelength of the light used. This result is surprising and is interpreted by the fact that electrons photogenerated in the arsenic triselenide layer become deeply trapped and are unable to discharge the device even though the buffer layer is very thin. This study demonstrates the fact that the inclusion of the amorphous arsenic triselenide buffer layer makes the X-ray detector immune to spurious electron injection from the substrate material inasmuch as the injected charge will become deeply trapped immediately in the arsenic triselenide material.

Finally, another feature of this invention relates to the requirement in some X-ray imaging systems to acquire images at video rates (30 images per second). The X-ray beam on-time is typically several minutes in this imaging mode which is called the dynamic mode imaging. Due to the finite electron range of doped amorphous selenium, typically $10^{-5}$ cm$^2$/V, a net negative space charge will accumulate in the selenium layer due to the long imaging exposure time and the superior transport properties of the holes. This negative space charge does not adversely affect the imaging performance provided that it remains constant for a time scale much longer than the imaging time scale. The negative space charge can change because of two processes—thermal detrapping of the electrons and subsequent sweep out or injection of holes from the upper biasing electrode and charge recombination. For selenium, the former process is unlikely inasmuch as the electron trap depth is 1.1 eV, leading to a thermal release time constant of several hours for the trapped electrons. A top electrode structure which minimizes hole injection is therefore required in this mode of operation. The use of a top unipolar conducting buffer layer, sandwiched between the doped amorphous selenium layer and the top biasing electrode, can thus significantly reduce the top hole injection into the bulk of the doped amorphous selenium layer.

For this purpose, an alkali doped thin selenium buffer layer with a hole range of less than $10^{-10}$ cm$^2$/V is directly deposited on the bipolar transport photoconductive selenium layer. A top conducting electrode is then deposited on top of this buffer layer. The extremely short hole range of the top buffer layer ensures that any hole injected from the top electrode will be trapped in this layer, thus preventing it from recombining with the negative space charge in the bulk selenium layer. This enables the negative space charge to be unaltered during the X-ray beam on-time. Under normal X-ray conditions where the top electrode is positively biased with respect to the bottom electrode, the electrons and holes generated in the amorphous selenium layer should both reach the top and bottom electrodes without being trapped. Thus, the thin alkali doped buffer layer must also not inhibit the flow of X-ray generated electrons to the top electrode. It has been shown, in this regard, that doping of selenium with Li, Na, and K severely degrade only the hole range, leaving the electron range relatively unaffected. Similarly, the aforementioned amorphous arsenic triselenide buffer layer is designed in such a way as to maximize the hole range, in order to allow the X-ray generated holes to reach the bottom electrode.

Figure 7:
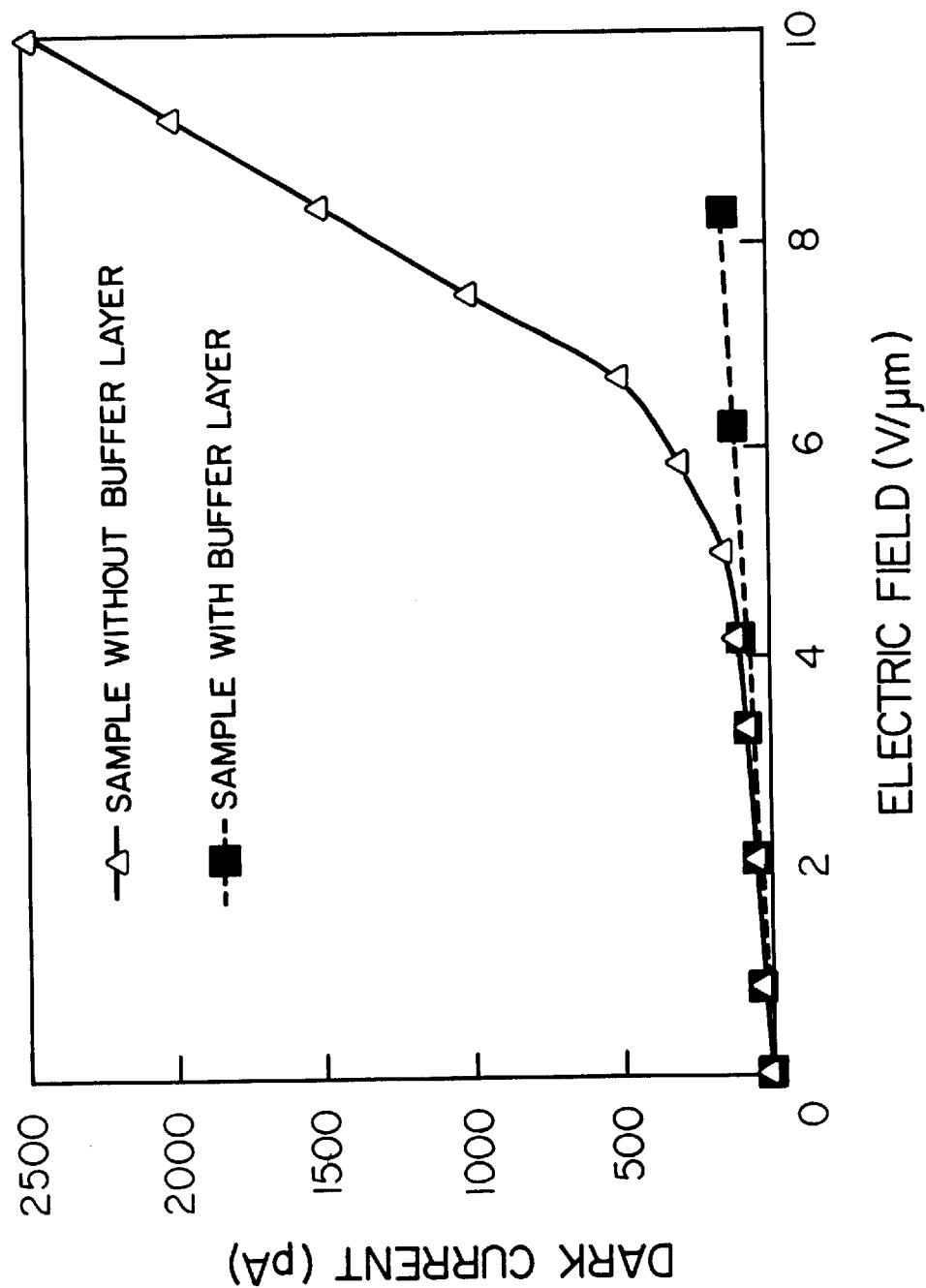
FIG. 7 is a comparative plot of dark current versus voltage characteristics for a device illustrated in FIG. 2($b$)

FIG. 7 shows a plot of the dark current-voltage characteristics of a device with a unipolar buffer layer 22 made of Na-doped selenium film as shown on the left hand side of FIG. 2(*b*), and without such layer 22 as shown on the right hand side of FIG. 2(*b*). The biasing electrodes 32, 34 consisted, in this case, of Pd. It can be seen from the graph in FIG. 7 (where pA means picoamperes) that the two devices behave quite differently at high electric fields, with the device that has no unipolar buffer layer having a much greater dark current. This is attributed to field-assisted emission of holes from the Pd electrode 34 into the selenium film 18. Once injected, these excess holes contribute to the large dark current which greatly exceeds the intrinsic resistivity of the device. On the other hand, the device with the unipolar conducting buffer layer 22 situated between the bias electrode 32 and the doped amorphous selenium film 18 has a much lower dark current at the same electric field. This is caused by the fact that any field-assisted injection of holes from the electrode material is abruptly stopped because these holes immediately get trapped in the Na-doped material. Once trapped, these holes actually lower the electric field at the electrode interface, which also tends to lower the hole injection rate.

To further illustrate how the unipolar Na-doped buffer layer is beneficial in fluoroscopy, a simple test was performed where the total current flowing from the device was measured in the presence of a pulsed X-ray beam with a total beam on-time of about 30 seconds. FIG. 8(*a*) shows the total current (dark current+X-ray current) as a function of time in the device without the unipolar buffer layer, whereas FIG. 8(*b*) shows the total current as a function of time in the device with the unipolar buffer layer. For the device having no unipolar buffer layer, it is clear that the dark current, as measured during the interval between the X-ray pulses, increases in value during the presence of the X-rays, and takes more than 30 seconds to return to its previous value before the application of the X-rays. This enhanced dark current is due to hole injection from the top electrode to neutralize the X-ray generated negative space charge in the selenium layer. In an imaging mode such as fluoroscopy, this dark current recovery time manifests itself in the form of an image lag inasmuch as an excess current still persists in that region of the detector long after the primary photocurrent has expired.

FIG. 8(*b*) shows the results of the same test performed on the device with the unipolar buffer layer. Here it is clear that the dark current remains stable during the application of the X-rays. When the final X-ray pulse expires, the current drops abruptly to the device's dark current value that was there before the X-ray exposure began. This novel device does not exhibit the detrimental image lag that the previous device demonstrated.

In FIGS. 8(*a*) and 8(*b*), reference to E-9 means that the number is to the exponential of -9.

It should be understood that the invention is not limited to the specific embodiments described above, but that many modifications obvious to those skilled in the art can be made without departing from the spirit of the invention and the scope of the following claims.

We claim:

1. A multilayer plate for X-ray imaging which comprises:
    (a) a substrate;
    (b) a biasing electrode; and
    (c) a selenium-based membrane sandwiched between said substrate and said biasing electrode, said membrane comprising a thick photoconductive layer of doped amorphous selenium and a thin buffer layer selected from:
        (i) an interstitial layer of amorphous arsenic triselenide, positioned between said photoconductive layer and said substrate; and
        (ii) a unipolar conducting layer of alkali doped selenium positioned between said photoconductive layer and said biasing electrode.

2. A multilayer plate for X-ray imaging which comprises:
    (a) a substrate;
    (b) a biasing electrode; and
    (c) a selenium-based membrane sandwiched between said substrate and said biasing electrode, said membrane comprising a thick photoconductive layer of doped amorphous selenium and two thin buffer layers consisting of:
        (i) an interstitial layer of amorphous arsenic triselenide, positioned between said photoconductive layer and said substrate; and
        (ii) a unipolar conducting layer of alkali doped selenium positioned between said photoconductive layer and said biasing electrode.

3. A multilayer plate according to claim 2, in which the photoconductive layer of doped amorphous selenium has a thickness of between about 200 µm and 500 µm.

4. A multilayer plate for X-ray imaging which comprises:
(a) a substrate;
(b) a conducting biasing electrode; and
(c) a selenium-based membrane sandwiched between said substrate and said biasing electrode, said membrane comprising a photoconductive layer of doped amorphous selenium having a thickness of between about 100 μm and 2 mm, and a unipolar conducting buffer layer of alkali doped selenium having a thickness of between about 0.5 μm and 10 μm, said buffer layer being positioned between said photoconductive layer and said biasing electrode.

5. A multilayer plate for X-ray imaging which comprises:
(a) a substrate;
(b) a biasing electrode; and
(c) a selenium-based membrane sandwiched between said substrate and said biasing electrode, said membrane comprising an interstitial buffer layer of amorphous arsenic triselenide having a thickness of between about 0.5 μm and 10 μm, a photoconductive layer of doped amorphous selenium having a thickness of between about 100 μm and 2 mm, and a unipolar conducting buffer layer of alkali doped selenium having a thickness of between about 0.5 μm and 10 μm, said photoconductive layer being itself sandwiched between said buffer layers, with the interstitial buffer layer of amorphous arsenic triselenide being positioned between said photoconductive layer and the substrate, and the unipolar conducting layer of alkali doped selenium being positioned between said photoconductive layer and the biasing electrode.

6. A multilayer plate according claim 1, in which the substrate is selected from the group consisting of aluminum, glass, a thin film transistor array, a charged coupled device and a complementary metal oxide semiconductor device.

7. A multilayer plate according to claim 1, used for dynamic mode X-ray imaging, in which the biasing electrode consists of a thin layer of conductive material.

8. A multilayer plate according to claim 7, in which the conductive material is selected from the group consisting of gold, platinum, aluminum, chromium, indium and indium tin oxide.

9. A multilayer plate according to claim 1, used for static mode X-ray imaging, in which the biasing electrode comprises a layer of an insulating dielectric material with a thin layer of a conductive material thereon.

10. A multilayer plate according to claim 9, in which the insulating dielectric material is selected from the group consisting of polycarbonate, polyester and parylene, and the conductive material is selected from the group consisting of gold, platinum, aluminum, chromium, indium and indium tin oxide.

11. A multilayer plate according to claim 1, in which the photoconductive layer of doped amorphous selenium is made of selenium doped with arsenic and chlorine.

12. A multilayer plate according to claim 1, in which said buffer layer of amorphous arsenic triselenide also includes dopants selected from the group consisting of iodine, indium and gallium in parts per million concentration.

13. A multilayer plate according to claim 1, in which said buffer layer of alkali doped selenium is doped with at least one of the alkali elements selected from the group consisting of Li, K, Na and H in 1–1000 ppm concentration.

14. A multilayer plate according to claim 13, in which said alkali doped selenium also includes arsenic in an amount of 0.5 to 5 wt %.

15. A multilayer plate according to claim 1, in which the photoconductive layer of doped amorphous selenium has a thickness of between about 200 μm and 500 μm.

16. A multilayer plate according to claim 2, in which the substrate is selected from the group consisting of aluminum, glass, a thin film transistor array, a charged coupled device and a complementary metal oxide semiconductor device.

17. A multilayer plate according to claim 2, used for dynamic mode X-ray imaging, in which the biasing electrode consists of a thin layer of conductive material.

18. A multilayer plate according to claim 17, in which the conductive material is selected from the group consisting of gold, platinum, aluminum, chromium, indium and indium tin oxide.

19. A multilayer plate according to claim 2, used for static mode X-ray imaging, in which the biasing electrode comprises a layer of an insulating dielectric material with a thin layer of a conductive material thereon.

20. A multilayer plate according to claim 19, in which the insulating dielectric material is selected from the group consisting of polycarbonate, polyester and parylene, and the conductive material is selected from the group consisting of gold, platinum, aluminum, chromium, indium and indium tin oxide.

21. A multilayer plate according to claim 2, in which the photoconductive layer of doped amorphous selenium is made of selenium doped with arsenic and chlorine.

22. A multilayer plate according to claim 2, in which said buffer layer of amorphous arsenic triselenide also includes dopants selected from the group consisting of iodine, indium and gallium in parts per million concentration.

23. A multilayer plate according to claim 2, in which said buffer layer of alkali doped selenium is doped with at least one of the alkali elements selected from the group consisting of Li, K, Na and H in 1–1000 ppm concentration.

24. A multilayer plate according to claim 23, in which said alkali doped selenium also includes arsenic in an amount of 0.5 to 5 wt %.

25. A multilayer plate according to claim 4, in which the buffer layer has a thickness of between about 1 μm and 5 μm.

26. A multilayer plate according to claim 5, in which the buffer layer has a thickness of between about 1 μm and 5 μm.

* * * * *